United States Patent [19]

Levien

[11] Patent Number: 5,337,264

[45] Date of Patent: Aug. 9, 1994

[54] TIME REVERSAL GAUSSIAN APPROXIMATION FILTER

[76] Inventor: Raphael L. Levien, P.O. Box 31, McDowell, Va. 24458

[21] Appl. No.: 891,789

[22] Filed: Jun. 1, 1992

[51] Int. Cl.⁵ .............................................. G06F 15/31
[52] U.S. Cl. .............................. 364/724.01; 364/724.17
[58] Field of Search .................. 364/724.01, 724.05, 364/724.12, 724.17, 724.19, 724.2; 375/103; 358/141, 142, 151

[56] References Cited

U.S. PATENT DOCUMENTS

| | | | |
|---|---|---|---|
| 3,370,292 | 2/1968 | Deerfield | 342/195 |
| 4,305,133 | 12/1981 | Amada et al. | 364/745 X |
| 4,317,092 | 2/1982 | Potter | 328/151 |
| 4,328,426 | 5/1982 | D'Ortenzio | 250/578 |
| 4,369,499 | 1/1983 | Northam | 364/D24 |
| 4,569,030 | 2/1986 | Butterweck et al. | 364/724.17 |
| 4,866,649 | 9/1989 | Fettweis | 364/724.14 |
| 4,984,187 | 1/1991 | Graybill et al. | 364/724.17 |
| 5,014,232 | 5/1991 | Andre | 364/724.19 |
| 5,031,132 | 7/1991 | Dolazza | 364/724.12 |
| 5,117,291 | 5/1992 | Fadavi-Ardekani et al. | 358/167 |

OTHER PUBLICATIONS

Jackson, "Discrete fourier Transform/High-speed Convolution", Digital Filter and Signal Processing, pp. 164–167.

Jose M. Costa, Design of Circularly Symmetric Two-Dimensional Recursive Filters—IEEE Transactions on Acoustics, Speech and Signal Processors vol. ASSP-22 No. 6 Dec. 1974.

Primary Examiner—Jerry Smith
Assistant Examiner—Chuong D. Ngo
Attorney, Agent, or Firm—Allan Jacobson

[57] ABSTRACT

A time reversal filter uses exponential decay infinite impulse response filters to achieve an approximation to a true Gaussian low pass filter. In one embodiment, a time reversal Gaussian approximation filter performs the forward and backward passes of a time reversal filter in essentially one pass using a segmented signal approach. The input signal is divided into segments, each segment is filtered first in the forward direction, then in the reverse direction, and the segments thus filtered are reassembled to form the output signal. In addition, the overlap in the reverse direction from each filtered segment extending backward into the prior filtered segment is preserved in memory and added to the output of reassembled segments.

25 Claims, 4 Drawing Sheets

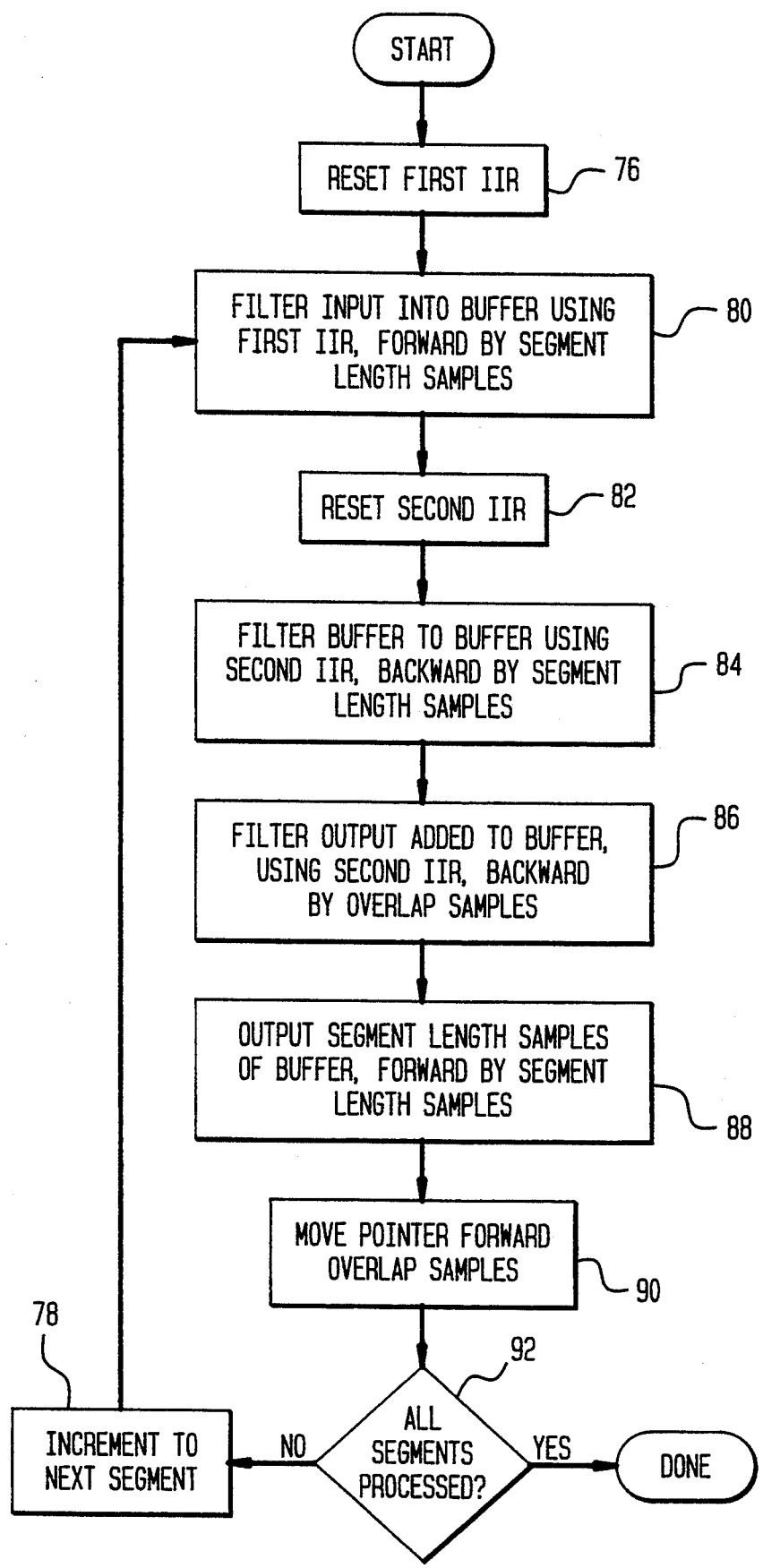

TIME REVERSAL GAUSSIAN APPROXIMATION FILTER

FIELD OF THE INVENTION

The present invention relates to filters useful in signal processing. In particular, the present invention relates to the field of time reversal filters for use in audio and image processing.

BACKGROUND OF THE INVENTION

Time reversal filters are used for processing both audio and video signals. For spatially filtering images, a separable filter, such as a Gaussian filter, is particularly desirable. Each horizontal scan line of pixels is filtered independently, then each vertical column of pixels is similarly filtered. If the filter is a true Gaussian filter, then the resulting filtering of the two dimensional image is radially symmetric. That is, at any arbitrary angle through the image, the resulting filtered image will be the same as if the line of pixels at such arbitrary angle were directly filtered by the Gaussian filter. To the extent that a close approximation to Gaussian filter is used, the resulting image filtering is close to radially symmetric. Due to its symmetry, the ideal Gaussian filter has no phase shift over all frequencies of interest.

One of the most important applications of Gaussian filtering is for sharpening, or edge enhancement. Gaussian filtering to sharpen an image is especially desirable when a photographic original has been scanned at very high resolution (for example, a 35 mm negative scanned at 4000 dots per inch). Scanning an image at very high resolution, i.e. significantly greater than that absolutely needed to capture the image detail within the Nyquist frequency of the sampling process, then sharpening using Gaussian filtering, produces an image with minimal image artifacts. The rotational symmetry of the Gaussian filter means that lines of any angle will be sharpened by an identical amount, a property not shared by the closest competitor to the Gaussian filter for image sharpening: the Laplacian (or 3×3 convolution) filter. Thus, the Gaussian filtering is popular for very high quality image processing systems.

Another application of Gaussian filtering is removing film grain, unwanted screens (as when scanning photos from a magazine), as well as other unwanted artifacts.

A drawback to Gaussian filtering is its relatively great computational cost. Most digital implementations of a Gaussian filter use finite impulse response (FIR) filters. The larger the extent, or, equivalently, the lower the cutoff frequency of the Gaussian filter, the more computationally expensive it is to implement. A typical implementation requires dozens of multiplications per pixel. Further, because the shape of the Gaussian curve is infinite in extent, practical implementations must truncate the actual curve, which can cause quality problems.

Time reversal filtering is known in the field of audio engineering. The input audio signal is filtered through a first stage, and the result recorded on tape. Then, the tape is played back backwards (i.e. in reverse) through a second, identical stage of filtering. The result is recorded on a second tape. When the second tape is played back again backwards, the result is the desired filtered audio signal. Symmetrical filtering is desired in the field of audio processing. The result of symmetrical time reverse filtering is an audio signal in which the frequencies have been filtered as desired, but the phase has been absolutely preserved.

There are many drawbacks to audio time reversal filtering. For one, it takes twice as long, because the tape must be run through a second time. For another, it requires twice as much tape. Further, the signal undergoes the degradation of two recording processes, which is a much more severe problem for analog than digital recording. Perhaps most importantly, it is completely unworkable for real time audio processing, because it is impossible to hear any results until the whole tape has been filtered.

SUMMARY OF THE INVENTION

The present invention is embodied in a low pass filter having an impulse response substantially equal to a Gaussian bell curve, while minimizing computational complexity. Specifically, the present invention is embodied in a novel architecture time reversal filter employing infinite impulse response (IIR) filters. Infinite impulse response filters, by themselves, tend to be asymmetrical. In one embodiment of the present invention, multiple stages of IIR filters are used in a time reversal filter, resulting in a perfectly symmetrical filter. A first stage of IIR filtering is performed in the forward direction, and an identical stage of IIR filtering is performed in the reverse, or backward direction. In the preferred embodiment of the present invention, an IIR filter element composed of a cascade of two filters with an exponential decay response, in series, is used in a time reversal filter to create a Gaussian approximation filter.

In accordance with another embodiment of the present invention, the forward and backward passes of a time reversal filter are performed in essentially one pass using a segmented approach. The input signal is divided into segments, each segment is filtered first in the forward direction, then in the reverse direction, and the segments thus filtered are reassembled, or spliced together to form the output signal. In addition, the overlap in the reverse direction from each filtered segment extending backward into the prior filtered segment is preserved in memory and added to the output of reassembled segments. Although, in theory, the output signal of an IIR filter continues for many samples after the input signal ceases (i.e. after the end of the segment, the output continues for an infinite amount of time), in practice the filter output drops below a threshold after a finite number of samples. Therefore, retaining a finite number of overlap samples for each segment in the reverse direction approximates the backward pass of the time reversal filter. Adding the overlap derived from filtering each segment in the reverse direction to the prior segment permits the independently time reverse filtered segments to be spliced together to form the continuous output signal.

In accordance with a further embodiment of the present invention, a single memory in the form of a circular buffer is used to store both the signal samples of each segment, and the overlap samples between segments. A pointer is moved forward and backward around the circular buffer to load, time reverse, and output the processed signal samples.

In accordance with yet another aspect of the present invention, multiple time reversal Gaussian approximation filters (TRGA) are combined to form more complex filters.

DESCRIPTION OF THE FIGURES

FIG. 4 is a flow chart diagram of a software program embodying the present invention.

DETAILED DESCRIPTION

Figure 1:
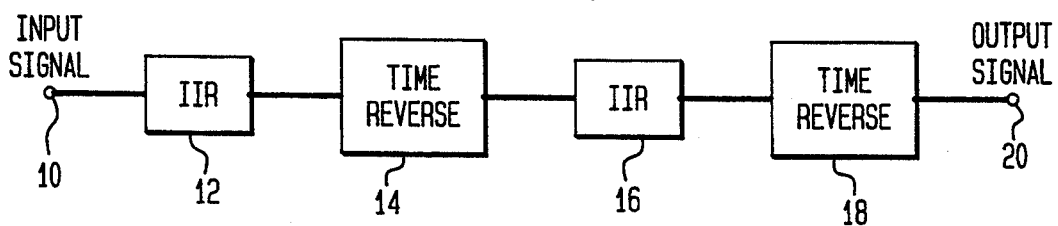
FIG. 1 is a block diagram of a prior art time reversal filter.

As shown in FIG. 1, a time reversal filter comprises a first IIR 12, a first time reversal memory 14, a second IIR 16 and a second time reversal memory 18. If time reversal is implemented by recording on magnetic tape or other mass memory, and by playing the tape or retrieving signal memory in reverse time order, then one IIR filter for forward and reverse filtering may for used in lieu of IIR filters 12 and 14. In operation, an input signal on terminal 10 is filtered by IIR 12, reversed in time by memory 14, filtered a second time by IIR 16, and finally reversed a second time by memory 18, to produce result signal 20.

The IIR Filter Design

Figure 2:
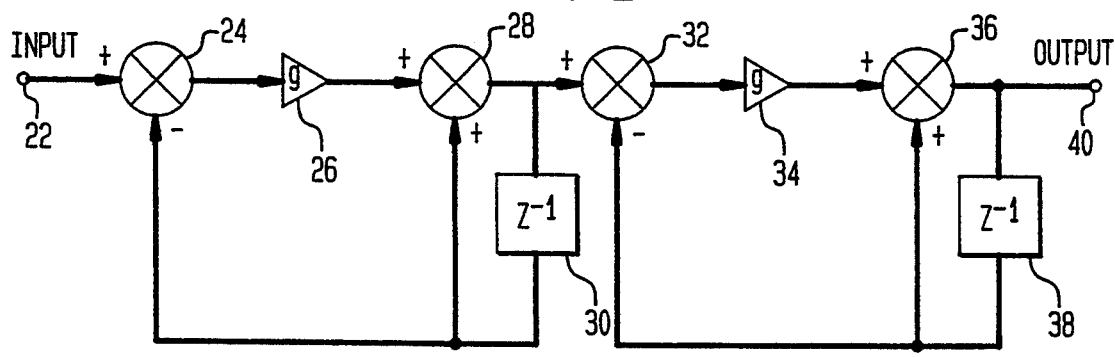
FIG. 2 is schematic diagram of an IIR filter which may be used for the IIR filter 12 or the IIR 16 in FIG. 1, in accordance with the present invention.

The design of the IIR filters 12 and 16 determines the impulse response of the filtering performed by the system. It is desirable that the impulse response approximate a Gaussian bell curve as closely as possible. An embodiment of a digital IIR filter is shown in FIG. 2. The filter consists of two exponential decay filters in series. An analog exponential decay filter is the familiar series resistance, parallel capacitance, low pass RC filter. In general, the response of an exponential decay filter to an impulse input is an exponential function, having declining positive output values, following an exponential curve into infinity.

Input terminal 22 is coupled to the positive input of subtractor 24. The output of subtractor 24 is coupled to the input of multiplier 26, the output of which is coupled to one input of adder 28. The output of adder 28 is coupled through a delay element 30, to feedback to the negative input of subtractor 24 and the other input of adder 28. Subtractor, 32, multiplier 34, adder 36, and feedback delay element 38 are connected in a similar fashion to form a second exponential decay filter in series. The final output is at terminal 38.

The parameter g, the gain of multipliers 26 and 34, controls the extent of the filter, i.e. the width of the Gaussian bell curve. A particularly desirable feature of the IIR filter of FIG. 2 is that the multiply by g operations can be accomplished by a simple shift operation when g is of the form $2^{-n}$ and by a simple shift and add when g is of the form $2^{-n}+2^{-m}$ or $2^{-n}-2^{-m}$.

Figure 3:
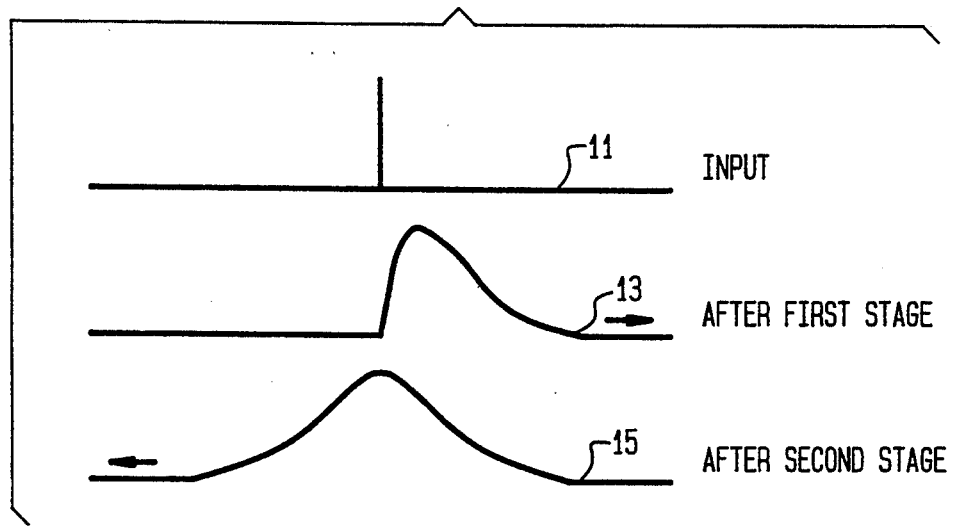
FIG. 3 is a time diagram of signals associated with the circuit of FIG. 2 in combination with the block diagram of FIG. 1, in accordance with the present invention.

The three waveforms of FIG. 3 illustrate the operation of the filter of FIG. 1 when IIR filters 12 and 16 are of the type shown in FIG. 2. The input signal 11 is an impulse input to terminal 10 (FIG. 1). An intermediate signal 13 is the output of the first IIR filter 12 (FIG. 1). The output signal 15 is the result after time reversal, filtering in IIR 16, and a second time reversal.

Overlapped Segments in One Dimension

The simplest way to accomplish time reversal is to record the entire signal into a (large) memory, and play back the entire signal in reverse order. An improved method of time reversal filtering in accordance with the present invention, is to divide the input signal into a number of segments, reverse each segment, filter each segment as desired, reverse each segment a second time, and finally combine the resulting segments to form the output signal.

The output signal of an IIR filter continues for many samples after the input signal ceases (i.e. after the end of the segment). In theory, it continues for an infinite amount of time, but in practice, it drops below a given threshold after a finite number of samples. If the signal is an image, the threshold can be set at $10^{-3}$, or if audio, at $10^{-6}$. The number of samples is $$\frac{\log \text{threshold}}{\log (1 - g)}$$

For example, if the threshold is $10^{-3}$ and g is 0.25, then the output of the IIR will decay below the threshold after about 25 samples. Thus, each segment is extended (overlapped with the adjacent prior segment) by 25 samples to allow for the decay of the IIR filter. When segments are recombined into a continuous signal, each extension will overlap the preceding segment. The recombination is performed by simple addition. FIGS. 3A-3G illustrate the process.

Figure 3A:
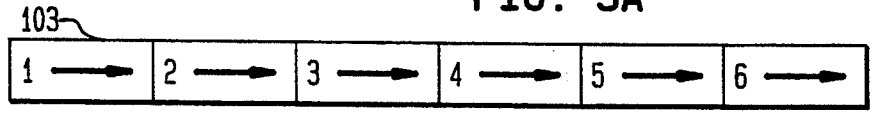
FIGS. 3A-3G are time diagrams which illustrate the operation of a TRGA filter embodying the present invention.
Figure 3B:
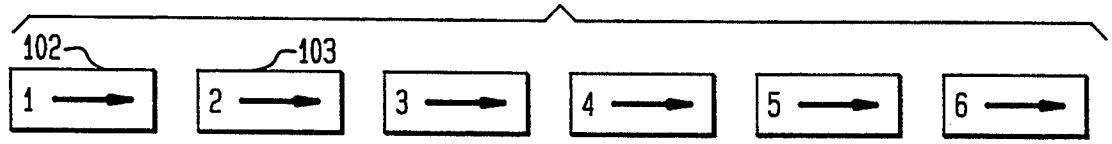
Figure 3C:
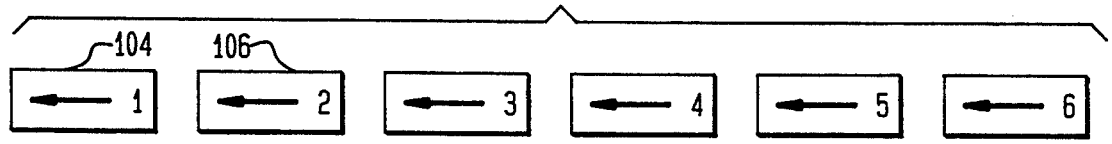
Figure 3D:
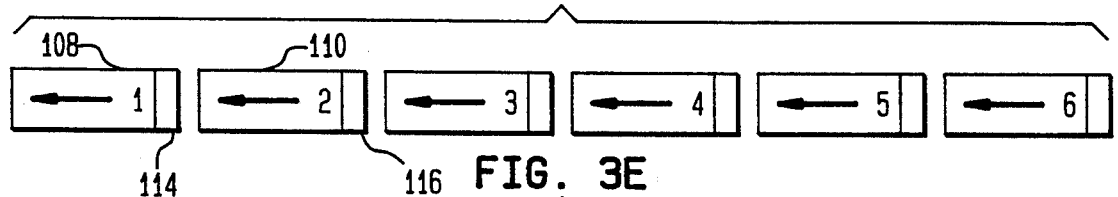

The original signal after the first IIR filter output, 100 in FIG. 3A, is divided into segments 102, 103 (FIG. 3B). Each segment is reversed in time to form segments 104, 106 in FIG. 3C. Then, each segment is filtered by a second IIR filter as shown by segments 108, 110 in FIG. 3D. Also, while filtering segment 108, overlap samples 114 are created following the filtering. Similarly, while filtering segment 110, overlap samples 116 are created.

Figure 3E:
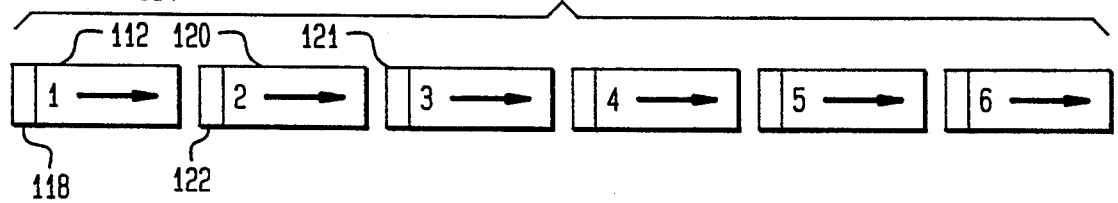
Figure 3F:
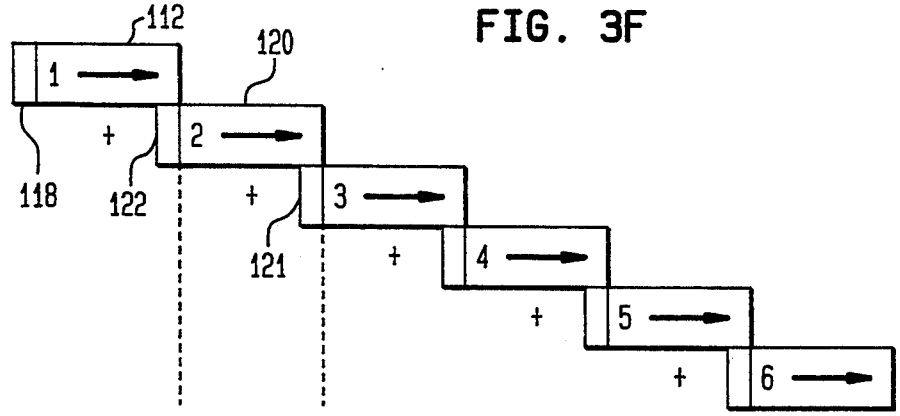
Figure 3G:
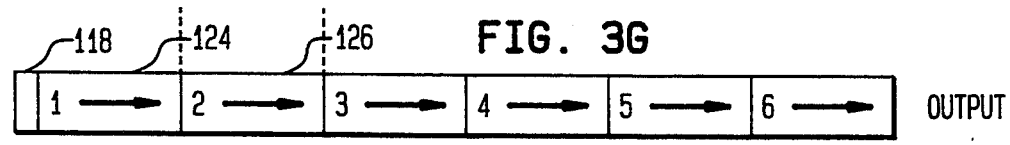

The reverse filtered segments with their respective overlap samples of FIG. 3D, are again time reversed in FIG. 3E to form forward segments 112, 120 with their respective forward overlap samples 118, 122. In FIG. 3F, forward segments 112, 120 are reassembled into the final output signal by adding the overlap 122, 121 from following segment to the respective portions of the prior segments. The final reassembled output signal segments 124, 126 are shown in FIG. 3G. The leading overlap samples 118 are the result of filtering the signal in the reverse direction back to the beginning plus the overlap in the reverse direction (overlap 114 in FIG. 3D), and then time reversing overlap 114 to form 118 in the output signal of FIG. 3G.

If a segment 102, 104 is stored in a random access memory, then it may be preferable to filter the segment in reverse direction, in place, rather than reverse the segment, filter it, and reverse it a second time. Memory to store the overlap samples 118, 122 would also be needed. Filtering in reverse direction, in place, is equivalent to the method described above.

A Software Implementation

Figure 6:
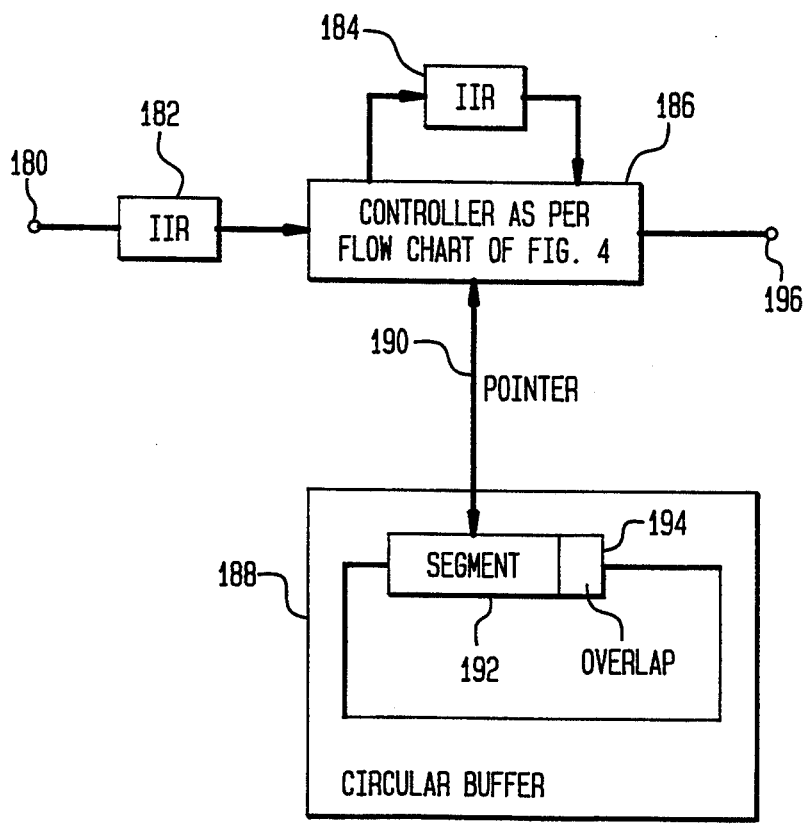
FIG. 6 is a block diagram of a TRGA filter embodying the present invention.

It is possible to implement the present invention in software, using a circular buffer. The size of the circular buffer is equal to the segment size plus the overlap (25 samples in the preceding example). The segment size should generally be a small multiple of the overlap (i.e. if the multiple is 3, the segment size is 75 samples, and the total buffer size is 100 samples). An equivalent block diagram of the implementation using a circular buffer is shown in FIG. 6. A first IIR filter 182 is coupled to input terminal 180, and to controller 186. A second IIR filter 184 is also coupled to controller 186. A circular buffer 188 is provided, having a length equal to the chosen segment 192 plus the overlap 194. An address pointer 190 indicates the location within the circular buffer 188 for reading and writing data samples. The buffer 188 is circular in that incrementing (or decrementing) the address pointer 190 past the edge of the overlap 194 (or below the edge of the segment 192) will result in the pointer moving to the opposite end of the buffer. In other words, the pointer is moved forward and backward using modulo arithmetic, modulo the buffer size. A circular buffer provides a single memory element to perform both the first time reversal of the output from the first IIR filter 182, and the second time reversal the output of the second IIR filter 184. Filter output is provided at terminal 196.

A flow chart of a software program for the operation of controller 186 is shown in FIG. 4. In outline form, the software implementation repeats the following sequence, in which each iteration processes one segment's worth of signal samples including overlap samples:

A. Filter input values using the first IIR filter. Store one segment length of results in buffer, moving buffer pointer forward one segment length of samples, at step 80. In this example, the pointer starts at 0, and ends up at 75, after storing one segment length of values.

B. Reset second IIR filter at step 82, by setting filter delay memory to zero. In an analog RC exponential filter, a reset operation is the equivalent of discharging the charge stored on the capacitor to an initial condition of zero volts.

C. Filter buffer contents in the reverse order using the second IIR filter, and storing the result back into the buffer at step 84. The pointer decrements backward a total of one segment length. Continuing the above example, the pointer starts at 75 and decrements down to 0.

D. For the overlap, input zeros into the second IIR filter, and add the result to the buffer contents, decrementing the pointer backward by the overlap length at step 86. That is, the overlap between segments in the reverse direction is added to stored samples of the previous segment in the forward direction. Since the buffer is circular, the pointer decrements for 25 values from 99 to 75.

E. Output one segment length of values from the buffer, incrementing the pointer forward a total of one segment length, at step 88. The pointer increments from 75 to 99 and then from 0 to 50.

F. The pointer is moved forward by one overlap length at step 90. The pointer jumps from 50 to 75.

Each iteration performs the same signal processing, but leaves the pointer moved forward in the circular buffer a total of one segment length. After each iteration, the program checks whether all segments have been processed at step 92, and if all segments are not processed, the next segment is indexed at step 78. On the second iteration, the pointer starts at 75 and ends at 50. On the third iteration, the pointer starts at 50 and ends at 25. On the fourth iteration, the pointer starts at 25 and ends at 0.

In more detail, the above algorithm can be expressed as:

```
sl = segment length
ol = overlap length
bl = sl + ol          <buffer length>
v1 = 0
v2 = 0
p = 0                 <pointer to buffer>
repeat
    for i = 1 to sl
        v = input value
        v1= v1 + g × (v − v1)
        v2= v2 + g × (v1 − v2)
        buf[p] = v2
        p = (p + 1) mod bl
    next
    v3 = 0
    v4 = 0
    for i = 1 to sl
        p = (p − 1) mod bl
        v3 = v3 + g × (buf[p] − v3)
        v4 = v4 + g × (v3 − v4)
        buf[p] = bf[p] + v4
    next
    for i= 1 to ol
        p= (p − 1) mod bl
        v3 = v3 − g × v3
        v4 = v4 + g × (v3 − v4)
        buf[p] = buf[p] + v4
    next
    for i = 1 to sl
        output value buf[p]
        p= (p = 1) mod bl
    next
    p = (p + ol) mod bl
``` until all values have been processed.

Image Filtering in Two Dimensions

As indicated above, image filtering applied separately in horizontal and vertical directions, making use of the property of separability of Gaussian filtering. Since the time reversal filter of the present invention is a close approximations to a Gaussian filter, the resulting filter response is close to radially symmetric. Scanned images are typically represented as a sequence of horizontal scan lines, known as a raster scan.

In the horizontal direction, each scan line is filtered using time reversal, but not using the segmented approach. However, in the vertical dimension, the segmented approach avoids the need to store all the scan lines of the image in order to perform TRGA filtering in the vertical direction. For vertical filtering, a buffer holds a number of scan lines, equal to the chosen segment length. Without the use of the segment technique, time reversal filtering is practical, but requires much disk activity if the image is too large to fit entirely in RAM. Given that the intermediate image stored on disk requires more bits (say, 16 instead of 8), and that it must be both written and read, it can require four times the amount of disk access than simply reading the source image or writing the resulting image. Further, the disk space or the disk may not be available. Thus, the method of segments, described above for the audio case, allows the filtering to proceed without requiring any disk storage. The intermediate segments are stored in RAM.

Audio Filtering

For audio signal processing, the present invention can be used for real time TRGA signal filtering. The output signal is delayed by the length of one segment, rather than for the entire two pass filtering process of recording, time reversal and playback. Thus, the present invention is very desirable for audio signal processing, in that it provides real time linear phase audio filtering. It also requires relatively few computational steps, yet results in very good quality at low cost.

Frequency Filtering with Time Reversal Filters

The TRGA filter described above is essentially a low pass filter, designed to approximate a Gaussian frequency response. However, there are also applications for other types of filters, such as high pass and band pass filters, as well as specialized filters in which it is desirable to have precise control over the filter frequency characteristics. Such specialized filters may be realized by connecting a number of TRGA filters in parallel, each of which is tuned to a different coefficient, and summing the results of these multiplications to produce the resulting filtered signal. All of the filters must have the same buffer size or be synchronized by some delay means. The multiplying coefficients are selected so the frequency response matches the desired frequency response as closely as possible. As indicated, TRGA filtering is special because passing input signals in both forward and reverse directions through an identical filter eliminates phase shift distortions. Therefore, the use of TRGA filters results in a composite filter with the desirable property of linear phase.

Figure 5:
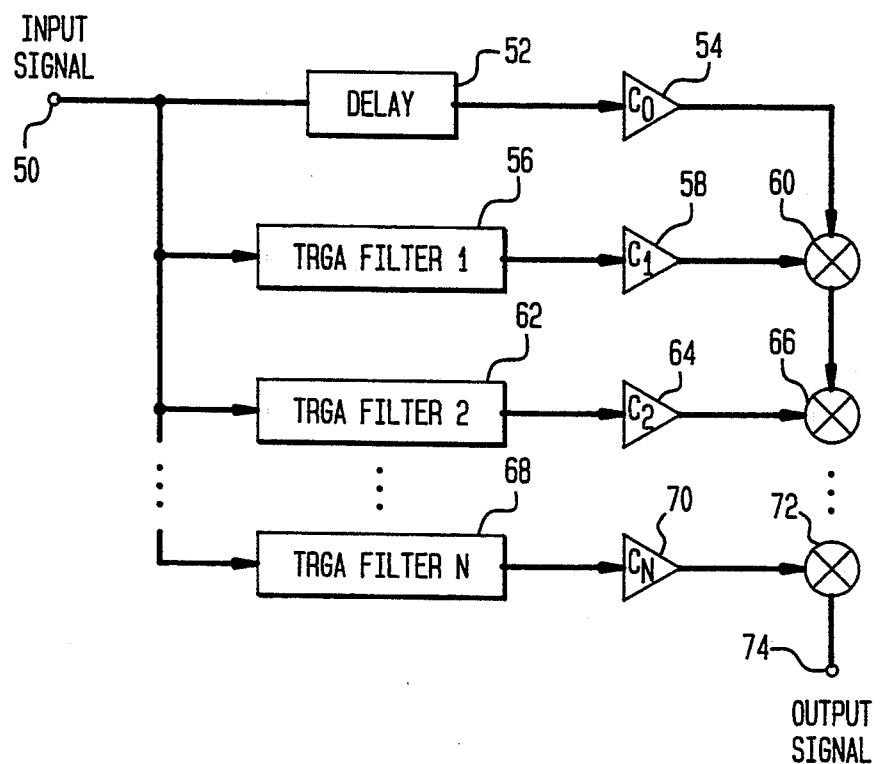
FIG. 5 is a block diagram of a composite filter utilizing TRGA filters of the present invention.

Referring to FIG. 5, the input signal at terminal 50 is coupled to a delay 52, and TRGA filters 56, 62, and 68. The delay 52 delays the signal so that it is synchronized with the response peaks of filters 56, 62, and 68. Filters 56, 62, and 68 are each tuned to a different frequency, by adjusting the g parameter (FIG. 2). The results are multiplied by multipliers 54, 58, 64, and 70, by coefficients $C_0$, $C_1$, $C_2$, through $C_n$. The results of the multipliers are in turn summed by adders 60, 66, and 72, resulting in output signal at terminal 74.

The frequency response of the composite filter will be equal to the sum of the frequency response of each filter multiplied by its corresponding coefficient C. Mathematically expressed, if the frequency response of filter i, is represented by $F_i(h)$, with $F_0(h)$ assumed to be equal to one, then the frequency response of the composite filter is:

$$\sum_{i=0}^{n} C_i \times F_i(h)$$

A significant advantage of the present invention is that the number of operations is constant no matter how large the extent of the filter. However, the memory required for the intermediate segments does increase linearly with the extent of the filter. In conventional 2-D FIR filtering systems, the number of multiplications is rises quadratically with the extent of the filter. In 1-D and more sophisticated separable 2-D implementations, the number of multiplications rises linearly with the extent.

Another significant advantage of the present filter is that all filters are inherently stable, avoiding the instability problems and complex instability detection and compensation circuitry of traditional IIR designs.

What is claimed is:

1. In a time reversal filter including an input terminal for receiving an input signal, a first filter coupled to said input terminal, a first time reversal memory coupled to said first filter, a second filter coupled to said first time reversal memory, a second time reversal memory coupled to said second filter and an output terminal coupled to said second time reversal memory, the improvement comprising:
   wherein said first and second filters are infinite impulse response filters, and wherein said first and second filters are both a cascade of two exponential decay filters in series.

2. A method for time reversal filtering an input signal, to form a time reverse filtered output signal, said method comprising:
   dividing said input signal into a plurality of segments;
   selecting a first segment of said plurality of segments in the time forward direction;
   time reverse filtering said first segment in the time reverse direction to form a first time reversed filtered segment;
   selecting a second segment following said first segment of said plurality of segments in the time forward direction;
   time reverse filtering said second segment in the time reverse direction to form a second time reversed filtered segment; and
   combining said first time reversed filtered segment and said second time reversed filtered segment in the time forward direction to form said time reverse filtered output signal.

3. A method in accordance with claim 2, wherein said step of time reverse filtering said second segment in the time reverse direction further comprises time reverse filtering said second segment in the time reverse direction beyond the length of said second time forward filtered segment by an overlap length to form a time reversed overlap segment.

4. A method in accordance with claim 3, further comprising time reversing said time reversed overlap segment to form an overlap segment.

5. A method in accordance with claim 4, wherein said step of combining said first time reversed filtered segment and said second time reversed filtered segment further comprises adding said overlap segment to said first filtered segment.

6. A method for time forward and time reversal filtering an input signal, to form a time forward filtered and time reverse filtered output signal, said method comprising:
   dividing said input signal into at least first and second segments, said second segment following said first segment in the time forward direction;
   filtering each said first and second segments in the time forward direction to form respective third and fourth segments;
   time reversing said third and fourth segments to form respective fifth and sixth segments;
   filtering said fifth and sixth segments in the time reverse direction to form respective seventh and eighth segments;
   time reversing said seventh and eighth segments to form respective ninth and tenth segments; and
   combining said ninth and tenth segments, wherein said tenth segment follows said ninth segment in the time forward direction to form said time forward filtered and time reverse filtered output signal.

7. A method in accordance with claim 6, wherein said step of filtering each said first and second segments in the forward direction to form respective third and fourth segments comprises filtering each said first and second segments in an infinite impulse response filter.

8. A method in accordance with claim 6 wherein said step of filtering said fifth and sixth segments to form seventh and eighth segments comprises filtering each said fifth and sixth segments in an infinite impulse response filter.

9. A method in accordance with claim 6, wherein said step of filtering said sixth segment further comprises filtering said sixth segment beyond the length of the sixth segment by an overlap length to form a time reversed overlap segment.

10. A method in accordance with claim 9, further comprising time reversing said time reversed overlap segment to form an overlap segment.

11. A method in accordance with claim 10, wherein said step of combining said ninth and tenth segments further comprises adding said overlap segment to said ninth segment.

12. An apparatus for time reversal filtering an input signal, to form a time reverse filtered output signal, said apparatus comprising:
means for dividing said input signal into a plurality of segments;
means for selecting a first segment of said plurality of segments in the time forward direction;
means for time reverse filtering said first segment in the time reverse direction to form a first time reversed filtered segment;
means for selecting a second segment following said first segment of said plurality of segments in the time forward direction;
means for time reverse filtering said second segment in the time reverse direction to form a second time reversed filtered segment; and
means for combining said first time reversed filtered segment and said second time reversed filtered segment in the time forward direction to form said time reverse filtered output signal.

13. An apparatus in accordance with claim 12, wherein said means for time reversing each of said segments and said overlap segment comprises a circular buffer.

14. An apparatus in accordance with claim 12, wherein said means for time reverse filtering said second segment in the time reverse direction further comprises means for time reverse filtering said second segment in the time reversed direction beyond the length of said second time forward filtered segment by an overlap length to form a time reversed overlap segment.

15. An apparatus in accordance with claim 14, further comprising means for time reversing said time reversed overlap segment to form an overlap segment.

16. An apparatus in accordance with claim 15, wherein said means for combining said first time reversed filtered segment and said second time reversed filtered segment further comprises means for adding said overlap segment to said first filtered segment.

17. An apparatus for time forward and time reversal filtering an input signal, to form a time forward filtered and time reverse filtered output signal, said apparatus comprising:
means for dividing said input signal into at least first and second segments, said second segment following said first segment in the time forward direction;
means for filtering each said first and second segments in the time forward direction to form respective third and fourth segments;
means for time reversing said third and fourth segments to form respective fifth and sixth segments;
means for filtering said fifth and sixth segments in the time reverse direction to form respective seventh and eighth segments;
means for time reversing said seventh and eighth segments to form respective ninth and tenth segments; and
means for combining said ninth and tenth segments, wherein said tenth segment follows said ninth segment in the time forward direction to form said time forward filtered and time reverse filtered output signal.

18. An apparatus in accordance with claim 17, wherein said means for filtering each said first and second segments in the forward direction to form respective third and fourth segments comprises means for filtering each said first and second segments in an infinite impulse response filter.

19. An apparatus in accordance with claim 17, wherein said means for filtering said fifth and sixth segments to form seventh and eighth segments comprises means for filtering each said fifth and sixth segments in an infinite impulse response filter.

20. An apparatus in accordance with claim 17, wherein said means for filtering said sixth segment further comprises means for filtering said sixth segment beyond the length of the sixth segment by an overlap length to form a time reversed overlap segment.

21. An apparatus in accordance with claim 20, further comprising means for time reversing said time reversed overlap segment to form an overlap segment.

22. An apparatus in accordance with claim 21, wherein said means for combining said ninth and tenth segments further comprises means for adding said overlap segment to said ninth segment.

23. A composite filter comprising:
an input terminal for receiving an input signal;
an output terminal;
a plurality of time reversal filters having respective input and output terminals, each of said plurality of time reversal filters providing a substantially similar signal delay between respective input and output terminals thereof;
means for coupling the respective input terminals of said plurality of time reversal filters to said input terminal; and
means for coupling the respective output terminals of said plurality of time reversal filters to said output terminal.

24. A composite filter in accordance with claim 23, wherein each of said plurality of time reversal filters comprises:
means for dividing said input signal into plurality of segments;
means for time reverse filtering each of said plurality of segments; and
means for combining said time reverse filtered plurality of segments to form a time reverse filtered output signal from said time reversal filter.

25. A composite filter in accordance with claim 23, further comprising a signal delay means having input and output terminals for providing a signal delay substantially equal to said signal delay of each of said plurality of time reversal filters, said input terminal of said delay means coupled to said input terminal, and said output terminal of said delay means coupled to said output terminal.

* * * * *